United States Patent
Liang et al.

[11] Patent Number: 6,054,344
[45] Date of Patent: Apr. 25, 2000

[54] OTP (OPEN TRIGGER PATH) LATCHUP SCHEME USING BURIED-DIODE FOR SUB-QUARTER MICRON TRANSISTORS

[75] Inventors: Mong-Song Liang, Hsin-Chu; Shyh-Chyi Wong, Taichung, both of Taiwan

[73] Assignee: Taiwan Semiconductor Manufacturing Company, Hsin-Chu, Taiwan

[21] Appl. No.: 09/182,760

[22] Filed: Oct. 30, 1998

[51] Int. Cl.[7] .............................. H01L 21/8238
[52] U.S. Cl. .................. 438/223; 438/218; 438/221; 438/231; 438/232
[58] Field of Search .................... 438/199, 218, 438/221, 223, 229, 232, 231

[56] References Cited

U.S. PATENT DOCUMENTS

| | | | |
|---|---|---|---|
| 4,525,920 | 7/1985 | Jacobs et al. | 29/571 |
| 4,806,501 | 2/1989 | Baldi et al. | 437/67 |
| 5,256,593 | 10/1993 | Iwai | 438/400 |
| 5,453,397 | 9/1995 | Ema et al. | 437/69 |
| 5,470,766 | 11/1995 | Lien | 437/31 |
| 5,494,851 | 2/1996 | Lee et al. | 438/450 |
| 5,604,150 | 2/1997 | Mehrad | 437/70 |
| 5,861,330 | 2/1999 | Baker et al. | 438/232 |
| 5,885,887 | 3/1999 | Hause et al. | 438/564 |
| 5,994,178 | 11/1999 | Wu | 438/221 |

*Primary Examiner*—Wael Fahmy
*Assistant Examiner*—Long Pham
*Attorney, Agent, or Firm*—George O. Saile; Stephen B. Ackerman

[57] ABSTRACT

Methods are described to prevent the inherent latchup problem of CMOS transistors in the sub-quarter micron range. Latchup is avoided by eliminating the low resistance between the $V_{dd}$ and $V_{ss}$ power rails caused by the latchup of parasitic and complementary bipolar transistor structures that are present in CMOS devices. These goals have been achieved without the use of guard rings by using p-region implants in the n-well to disconnect the pnp collector to npn base connection of two parasitic bipolar transistors. Further, the p-region implants are shorted to a reference voltage $V_{ss}$ via a p[+] ground tab thus backbiasing the diode-like p-region implants. The proposed methods are compatible with CMOS processes.

30 Claims, 4 Drawing Sheets

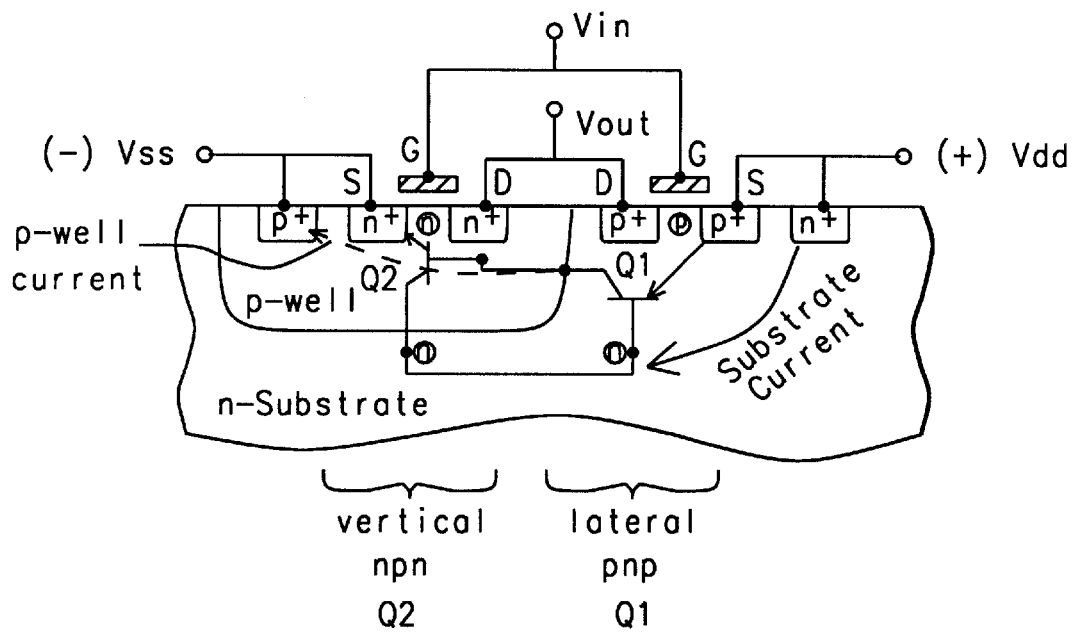
FIG. 1 - Prior Art
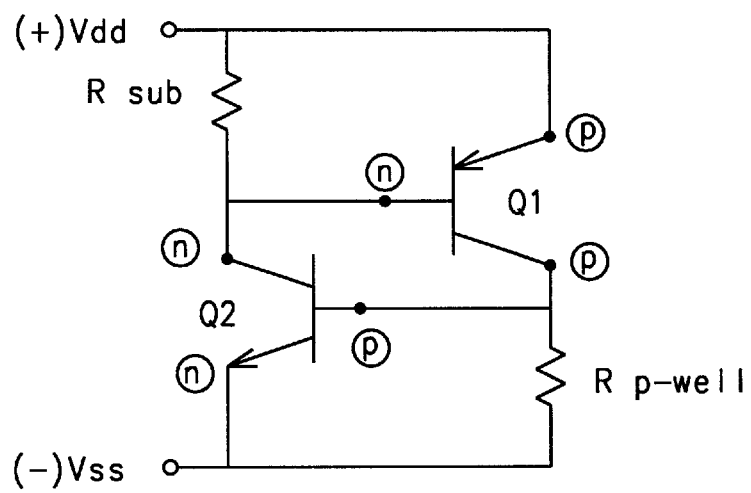
FIG. 2 - Prior Art

OTP (OPEN TRIGGER PATH) LATCHUP SCHEME USING BURIED-DIODE FOR SUB-QUARTER MICRON TRANSISTORS

RELATED PATENT APPLICATION

TSMC98-010, OTP (OPEN TRIGGER PATH) LATCHUP SCHEME USING TRIPLE AND BURIED WELL FOR SUB-QUARTER MICRON TRANSISTORS, title filing date: Oct. 30, 1998, Ser. No. 09/182,760 assigned to a common assignee.

BACKGROUND OF THE INVENTION

1. Field of the Invention

The invention relates to methods of producing integrated circuits on a semiconductor wafer, and more particularly to methods of fabricating complementary metal oxide semiconductor (CMOS) transistors without causing latchup.

2. Description of the Related Art

Latchup is a phenomenon of CMOS circuits and is well described by S. Wolf in *Silicon Processing for the VLSI Era*, Volume 2, by Lattice Press, copyright 1990, 6.4 LATCHUP IN CMOS, page 400: "A major problem in CMOS circuits is the inherent, self-destructive phenomenon known as latchup. Latchup is a phenomenon that establishes a very low-resistance path between the $V_{DD}$ and $V_{SS}$ power lines, allowing large currents to flow through the circuit. This can cause the circuit to cease functioning or even to destroy itself (due to heat damage caused by high power dissipation).

The susceptibility to latchup arises from the presence of complementary parasitic bipolar transistor structures, which result from the fabrication of the complementary MOS devices in CMOS structures. Since they are in close proximity to one another, the complementary bipolar structures can interact electrically to form device structures which behave like pnpn diodes."

FIG. 1 shows a cross-sectional view of a p-well CMOS inverter with input $V_{in}$, output $V_{out}$, supply voltage $(+)V_{dd}$, and reference voltage $(-)V_{ss}$. The n-channel (NMOS) transistor is in the p-well. Q1 is the lateral pnp parasitic transistor structure and Q2 is the vertical npn parasitic transistor structure which results from the arrangement of NMOS and p-channel (PMOS) transistors. The lateral transistor Q1 comprises the source S of the PMOS transistor (emitter), the n-substrate (base), and the p-well (collector). The vertical transistor Q2 comprises the source S of the NMOS transistor (emitter), the p-well (base), and the n-substrate (collector). The region of each terminal is identified by a circle with an "n" or a "p". Substrate current flows from $(+)V_{dd}$ through the n-substrate, having a resistance $R_{sub}$, to the collector of Q2. P-well current flows from the collector of Q1 through the p-well, having resistance $R_{p-well}$, to $(-)V_{ss}$.

FIG. 2, is an equivalent circuit diagram of the parasitic transistors of FIG. 1. Again the region of each transistor terminal is identified by a circle with an "n" or a "p". In this circuit the base of each transistor is connected to the collector of the other transistor. Inspection of FIG. 2 shows that this circuit is the equivalent of a parasitic pnpn diode (from emitter of Q1 to emitter of Q2). A pnpn diode below a certain "trigger" voltage acts as a high impedance, but when biased beyond that "trigger" voltage will act as a low impedance device similar to a forward biased diode. This results in a current that depends on $R_{sub}$ and $R_{p-well}$ and can be destructive to the CMOS circuit.

Clearly, latchup is not a new problem, however, it is becoming much more severe as devices shrink to quarter and subquarter micron dimensions, because of the reduced well depth and inter-well spacing. The method of providing a guard ring only stabilizes the potential on the surface and, hence, is not efficient in preventing latchup in the bulk of the semiconductor. Latchup can be avoided by isolating n-wells from p-wells at the cost of consuming more silicon real estate. Quoting from S. Wolf in *Silicon Processing for the VLSI Era*, Volume 3, by Lattice Press, copyright 1995, 6.6 CMOS ISOLATION TECHNOLOGY, page 374:

"The large area penalty of p-channel-to-n-channel device isolation is the most important reason why CMOS technologies using conventional isolation methods cannot achieve as high a packing density as NMOS. Furthermore, while new techniques such as epitaxy greatly reduce latchup susceptibility as CMOS is scaled down, they generally do not suppress leakage currents in the parasitic MOS structures. Hence, the layout spacing between an n-channel and a p-channel device may be limited by isolation failure rather than by latchup."

A large number of workers in the field have tackled the problem and found solutions which are suitable to one application or another, but the problem of latchup keeps on surfacing as transistor dimensions decrease in both the horizontal and vertical dimension.

U.S. Pat. No. 5,453,397 (Ema et al.) discloses a method capable of isolating fine pattern elements using LOCOS.

U.S. Pat. No. 5,470,766 (Lien) teaches a triple well with a p-region under FOX isolation regions. Lien addresses latch-up immunity for PMOS FETs.

U.S. Pat. No. 5,604,150 (Mehrad) discloses a triple-well structure, where the channel-stop impurity is implanted using multiple doses at different energies.

U.S. Pat. No. 4,525,920 (Jacobs et al.) shows a method of forming twin wells and other implants.

U.S. Pat. No. 4,806,501 (Baldi et al.) teaches a method for making twin tub devices with trench isolation.

None of the above-cited examples of the related art provide the combination of shallow trench isolation (STI) structures and implanted p-regions separating twin wells, and where additional p-regions are implanted and tied to $V_{ss}$ (ground) to prevent latchup in deep sub-quarter micron CMOS transistors.

SUMMARY OF THE INVENTION

It is an object of the present invention to provide methods to prevent the inherent latchup problem of CMOS circuits by eliminating the low resistance between the $V_{dd}$ and $V_{ss}$ power rails caused by the latchup of parasitic, complementary bipolar transistors which are present in CMOS devices.

Another object of the present invention is to eliminate the use of guard rings and their concomitant penalty in silicon real estate.

A further object of the present invention is to provide a method which is compatible with CMOS processes.

A yet further object of the present invention is to provide the above benefits for sub-quarter micron transistors.

These objects have been achieved by using p-region implants, to separate p- and n-wells, and by using additional p-region implants under a field region in an n-well, which are tied to a reference voltage $V_{ss}$ (ground). These additional p-region implants are acting as a pair of backbiased diodes to disconnect the npn collector to pnp base connection of the aforementioned two parasitic bipolar transistors.

BRIEF DESCRIPTION OF THE DRAWINGS

FIG. 1 is a cross-sectional view of a p-well CMOS inverter of conventional design of the prior art with parasitic bipolar transistors shown schematically.

FIG. 2 is an equivalent circuit diagram of the parasitic bipolar transistors of FIG. 1.

DESCRIPTION OF THE PREFERRED EMBODIMENT

Figure 3:
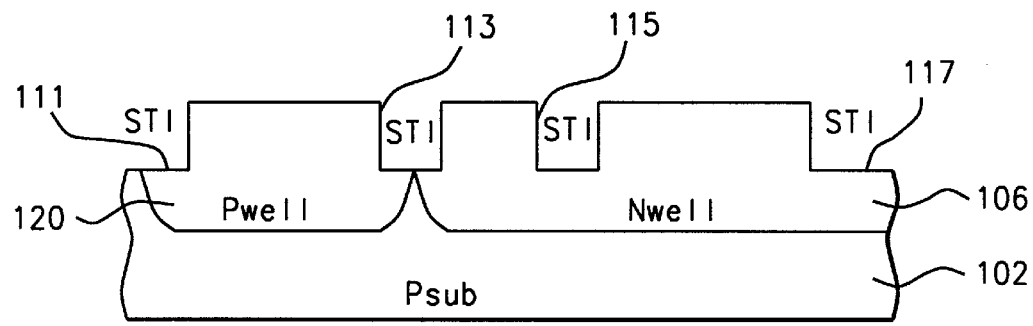
FIGS. 3 through 7 are cross-sectional views of a process sequence of fabricating a CMOS semiconductor device according to the embodiment of the present invention.

Referring now to FIGS. 3 to 7, we begin a description of the invention of preventing latchup in complementary metal-oxide semiconductor (CMOS) transistors by inhibiting the latchup path. FIG. 3 illustrates forming an n-well 106 and a p-well 120 on a p-substrate 102 of a semiconductor wafer 100, where p-well 120 is touching n-well 106, and etching shallow trench isolation (STI) structures 111, 113, 115, and 117. STI structure 111 is located half-way in p-well 120 which ends there, STI structure 113 straddles p-well 120 and n-well 106, and STI structures 115 and 117 are located in n-well 106.

Figure 4:
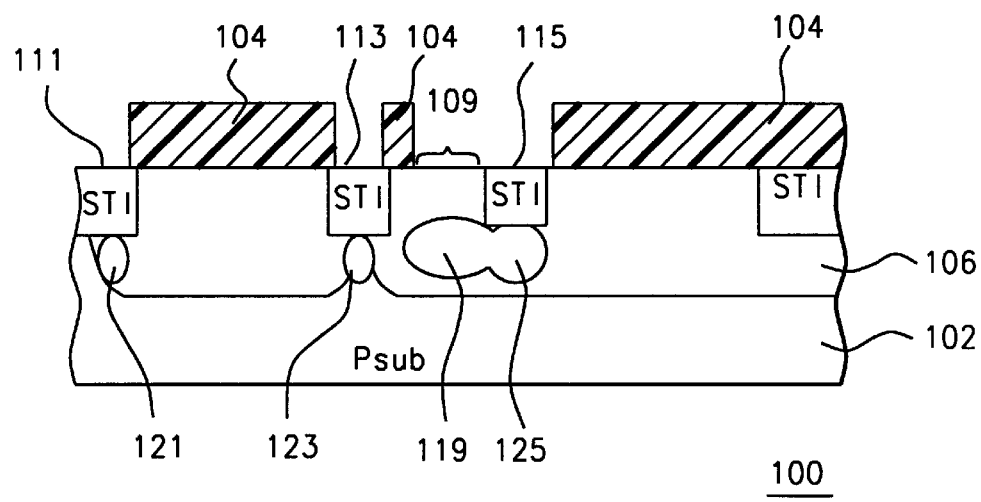

FIG. 4 shows creating a field region 109 in n-well 106, where field region 109 is located between STI structures 113 and 115; next is created a first p-region open trigger path (OTP) implant 119 below field region 109; subsequently is created a second p-region OTP implant 121, 123, 125 below STI structures 111, 113, 115, respectively.

Figure 5:
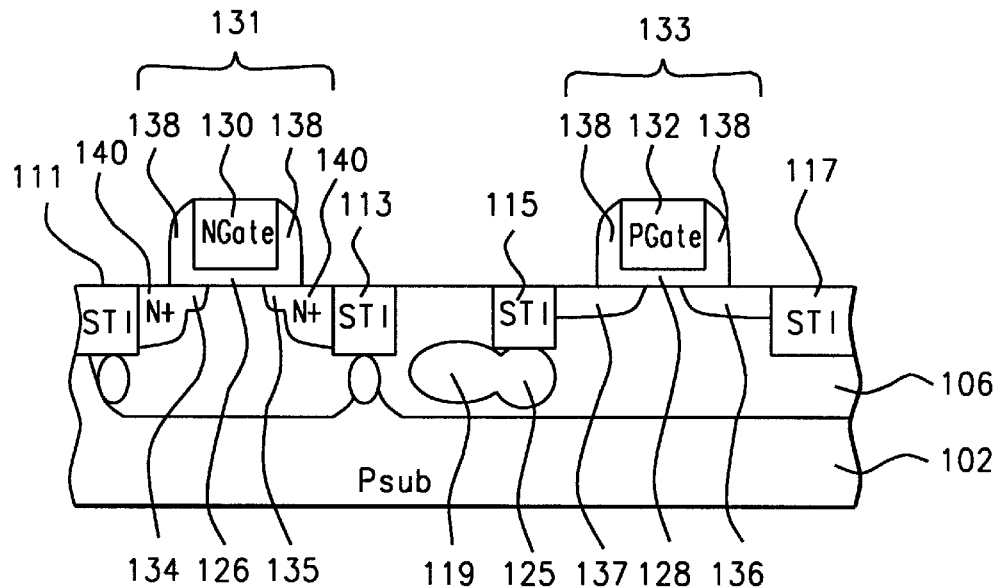
Figure 6:
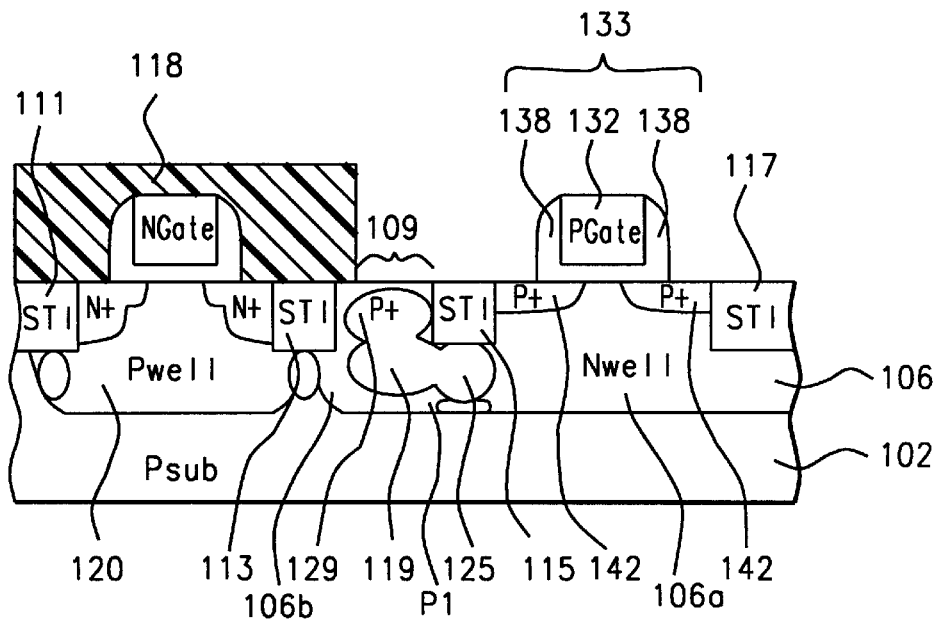

Next follows, in FIG. 5, the creating of n-channel transistor 131 in p-well 120. Referring now to FIG. 6, we draw attention to the path below p-region OTP implant 125 and p-substrate 102. This path, labeled region P1, effectively separates n-well 106 into two sections 106a and 106b. Section 106a is the area defined by transistor 133, and section 106b is the area between STI 113 and STI 115. Regions 106a and 106b are relatively "not connected", because a) physically there exists a large separation between 106a and 106b, produced by the width of field region 109 and STI structure 115, and b) region P1 is very thin, creating only a weak conductivity path.

Figure 7:
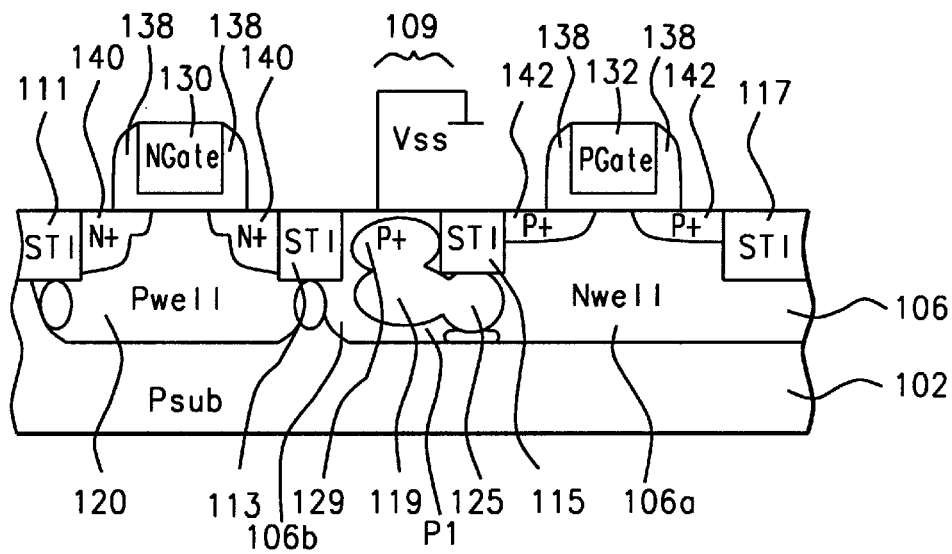

Still referring to FIG. 6, next follows the creation of p-channel transistor 133 in n-well 106, and p$^+$ ground tab 129 under field region 109, where p$^+$ ground tab 129 contacts p-region OTP implant 119 at 109 surface. In FIG. 7, p$^+$ ground tab 129 is connected to reference voltage $V_{ss}$ (typically ground).

Figure 8:
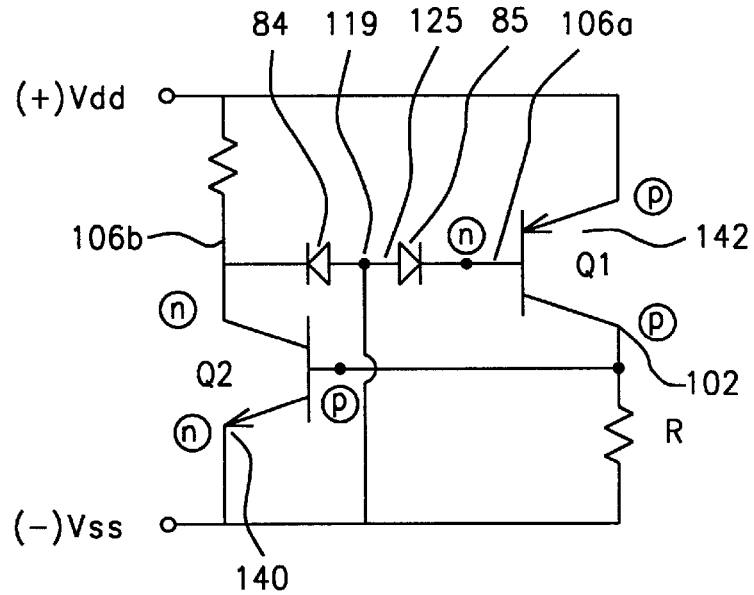
FIG. 8 is an equivalent circuit diagram of the parasitic bipolar transistors and of the two diodes of the CMOS transistor structure of FIG. 7.

We now describe in FIG. 8 the equivalent circuit diagram of the CMOS structure of FIG. 7. Note that FIG. 8 has some similarities with FIG. 2, except that diode pair 84, 85 has been added. Diodes 84 and 85 are joined at their anodes (which represent p-region OTP implants 119 and 125) and are tied to reference voltage $V_{ss}$. The path to $V_{ss}$ goes from p-region OTP implant 125 to p-region OTP implants 119 to p$^+$ ground tab 129. Both diodes are thus backbiased, and, therefore, not conducting. The connection (trigger path) between the collector of parasitic transistor Q2 and the base of parasitic transistor Q1 is, thus, open. Parasitic transistor Q1 is formed by source 142 (emitter, p-region), n-well section 106a (base), and p-substrate 102 (collector). Separated from transistor Q1 by region P1, parasitic transistor Q2 is formed by source 140 (emitter, n-region), p-well 120 (base), and n-well section 106b (collector) below field region 109 (between STI structures 113 and 115). Diode 84 represents the junction from p-region OTP implant 119 to n-well section 106b. Diode 85 represents the junction from p-region OTP implant 125 to n-well section 106a. The connection between the collector of Q1 and the base of Q2 still exists via p-substrate 102 and p-well 120.

Referring once again to FIG. 3, the method for manufacturing the present invention of preventing latchup in complementary metal-oxide semiconductor (CMOS) transistors starts with:

providing a semiconductor wafer 100 with a p-substrate 102;

forming an n-well 106 on top of p-substrate 102;

forming a p-well 120 on top of p-substrate 102, where p-well 120 is located adjacent to n-well 106;

etching in the same step:

1) a first STI structure 111 in p-well 120;

2) a second STI structure 113, which is straddling p-well 120 and n-well 106;

3) a third STI structure 115 in n-well 106; and etching a fourth STI structure 117 in n-well 106.

Referring now to FIG. 4, the method continues with:

covering the surface of semiconductor wafer 100 with a first photoresist 104;

etching away in the same step:

1) first photoresist 104 from first STI structure 111 and from second STI structure 113;

2) first photoresist 104 from a field region 109 and third STI structure 115, where field region 109 is located between second STI structure 113 and third STI structure 115, and where field region 109 is adjacent to third STI structure 115;

creating in the same step using p$^+$ implantation:

1) a first p-region OTP implant 119 immediately below field region 109; and 2) a second p-region OTP implant 121, 123, and 125 immediately below first STI structure 111, second STI structure 113, and third STI structure 115, respectively.

Implants 121, 123, and 125 are located lower than implant 119 because STI regions 111, 113, and 115 are empty now.

We continue the method of the invention with FIG. 5, by:

forming an oxide in each of the STI structures 111, 113, 115, and 117, where STI structure 111 isolates p-well 120 from other structures (not shown), where STI structure 113 isolates n-well 106 from p-well 120, where STI structure 115 isolates field region 109 from n-well 106;

adjusting an n-channel (NMOS) voltage threshold by ion implantation in p-well 120;

adjusting a p-channel (PMOS) voltage threshold by ion implantation in n-well 106 in an area between third STI structure 115 and fourth STI structure 117;

depositing a first gate oxide layer 126 in p-well 120;

depositing a second gate oxide layer 128 in n-well 106;

forming a first polysilicon gate structure 130 on top of first gate oxide layer 126;

forming a second polysilicon gate structure 132 on top of second gate oxide layer 128;

implanting lightly doped n-drains (Nldd) 134 and 135 to either side of first polysilicon gate structure 130;

implanting lightly doped p-drains (Pldd) 136 and 137 to either side of second polysilicon gate structure 132;

forming sidewall spacers 138 to either side of first polysilicon gate structure 130; and forming sidewall spacers 138 to either side of second polysilicon gate structure 132; and implanting n$^+$ drains/sources 140 to either side of sidewall spacers 138 adjacent to first polysilicon gate structure 130, where after implantation, first polysilicon gate structure 130 becomes n$^+$.

The method continues with FIG. 6 by:

covering p-well 120 with a second photoresist 118, including first STI structure 111 and second STI structure 113;

implanting p+ drains/sources 142 to either side of sidewall spacers 138 adjacent to second polysilicon gate structure 132, where after implantation, second polysilicon gate structure 132 becomes p+;

creating a p+ ground tab 129 under field region 109;

removing second photoresist 118; and, see FIG. 7, connecting p+ ground tab 129 to reference voltage $V_{ss}$.

N-well 106 may be implanted using arsenic or phosphorus; p-well 120 may be implanted using boron or boron difluoride $BF_2$. Referring to FIG. 7, n+ sources/drains 140 abut against first STI structure 111 and second STI structure 113 and, p+ sources/drains 142 abut against third STI structure 115 and fourth STI structure 117. P+ ground tab 129 contacts first p-region OTP implant 119, and implant 119 contacts second p-region OTP implant 125 under third STI structure 115. The junction from first p-region OTP implant 119 to n-well 106 under field region 109 acts as reverse biased diode 84 of FIG. 8. The junction from second p-region OTP implant 125 under third STI structure 115 to n-well 106 between third STI structure 115 and fourth STI structure 117 acts as reverse biased diode 85.

The processes underlying the method of the present invention have the following characteristics:

arsenic concentration for Nldd ranges from $1 \times 10^{13}$ to $5 \times 10^{14}$ atoms/cm$^3$, and for nsd from $5 \times 10^{14}$ to $1 \times 10^{16}$ atoms/cm$^3$ at energies ranging from 10 keV to 80 keV;

phosphorus concentration for Nldd ($V_{th(pmos)}$) ranges from $1 \times 10^{11}$ to $1 \times 10^{13}$ atoms/cm$^3$ at energies ranging from 10 keV to 80 keV;

boron and boron difluoride concentration ranges from $1 \times 10^{13}$ to $1 \times 10^{16}$ atoms/cm$^3$ at energies ranging from 10 keV to 60 keV;

n-well and p-well concentration ranges from $5 \times 10^{15}$ to $1 \times 10^{18}$ atoms/cm$^3$;

the depth of the shallow trench ranges from 0.05 to 0.4 um, and the width ranges from 0.1 to 5 um;

the thickness of the thermal oxide layer for the shallow trench ranges from 0.05 to 0.4 um;

ion implantation for $V_T$ ranges from 20 keV to 100 keV;

doping of ldd for N and P ranges from $1 \times 10^{13}$ to $5 \times 10^{14}$ atoms/cm$^2$;

the focus depth for the p-region OTP implant from the 109 surface ranges from 0.1 to 0.8 um;

the width of field region 109 plus the width of STI 115 combined ranges from 0.2 um to 2 um.

The method of the present invention provides the following advantages:

The pnp base current of parasitic transistor Q1 is eliminated by p-region implants in the n-well, which act as reverse biased diodes 84 and 85, removing latchup problems associated with CMOS circuits, the use of guard rings is avoided, increased packing density saves significant silicon real estate, the method is compatible with CMOS processes for transistors in the sub-quarter micron region, lowered cost of manufacturing product.

While the invention has been particularly shown and described with reference to the preferred embodiments thereof, it will be understood by those skilled in the art that various changes in form and details may be made without departing from the spirit and scope of the invention.

What is claimed is:

1. A method of preventing latchup in complementary metal-oxide semiconductor (CMOS) transistors, comprising:

providing a semiconductor wafer having a p-substrate;

forming an n-well on top of said p-substrate;

forming a p-well on top of said p-substrate, said p-well touching said n-well;

etching in the same step:
 a first shallow trench isolation (STI) structure in said p-well;
 a second STI structure, said second STI structure straddling said n-well and said p-well;
 a third STI structure in said n-well;

etching a fourth STI structure in said n-well;

creating a field region in said n-well;

creating in the same step using p+ implantation:
 a first p-region OTP implant below said field region;
 a second p-region OTP implant below each of said first, second, and third STI structures;

creating an n-channel transistor in said p-well;

creating a p-channel transistor in said n-well;

creating a p+ ground tab under said field region; and connecting said p+ ground tab to a reference voltage.

2. The method of claim 1, wherein said second p-region OTP implant below said third STI structure makes contact with said first p-region OTP implant.

3. The method of claim 1, wherein said field region is located between said second STI structure and said third STI structure.

4. The method of claim 1, wherein said p+ ground tab is making contact with said first p-region OTP implant.

5. The method of claim 1, wherein a junction from said first p-region OTP implant to said n-well under said field region acts as a reverse biased diode.

6. The method of claim 1, wherein a junction from said second p-region OTP implant under said third STI structure to said n-well located between said third STI structure and said fourth STI structure acts as a reverse biased diode.

7. A method of preventing latchup in complementary metal-oxide semiconductor (CMOS) transistors, comprising:

providing a semiconductor wafer having a p-substrate;

forming an n-well on top of said p-substrate;

forming a p-well on top of said p-substrate, said p-well located adjacent to said n-well;

etching in the same step:
 a first shallow trench isolation (STI) structure in said p-well;
 a second STI structure, said second STI structure straddling said n-well and said p-well;
 a third STI structure in said n-well;

etching a fourth STI structure in said n-well;

covering said semiconductor wafer with a first photoresist;

etching away in the same step:
 said first photoresist from said first STI structure and from said second STI structure;
 said first photoresist from a field region and said third STI structure, said field region being adjacent to said third STI structure;

creating in the same step using p+ implantation:
 a first p-region OTP implant immediately below said field region;

a second p-region OTP implant immediately below each of said first STI structure, said second STI structure, and said third STI structure;

locating said second p-region OTP implants below said first p-region OTP implant;

forming an oxide in each of said STI structures for isolation;

adjusting an n-channel (NMOS) voltage threshold by ion implantation in said p-well;

adjusting a p-channel (PMOS) voltage threshold by ion implantation in said n-well between said third STI structure and said fourth STI structure;

depositing a first gate oxide layer in said p-well;

depositing a second gate oxide layer in said n-well;

forming a first polysilicon gate structure on top of said first gate oxide layer;

forming a second polysilicon gate structure on top of said second gate oxide layer;

implanting lightly doped n-drains (Nldd) to either side of said first polysilicon gate structure;

implanting lightly doped p-drains (Pldd) to either side of said second polysilicon gate structure;

forming sidewall spacers to either side of said $n^+$ polysilicon gate structure;

forming sidewall spacers to either side of said $p^+$ polysilicon gate structure;

implanting $n^+$ drains and $n^+$ sources to either side of said sidewall spacers adjacent to said first polysilicon gate structure, where after implantation, said first polysilicon gate structure becomes $n^+$;

covering said p-well with a second photoresist, including said first STI structure and said second STI structure;

implanting $p^+$ drains and $p^+$ sources to either side of said sidewall spacers adjacent to said second polysilicon gate structure, where after implantation, said second polysilicon gate structure becomes $p^+$;

creating a $p^+$ ground tab under said field region;

removing said second photoresist; and connecting said $p^+$ ground tab to a reference voltage.

8. The method of claim 7, wherein said n-well is implanted using arsenic.

9. The method of claim 7, wherein said n-well is implanted using phosphorus.

10. The method of claim 7, wherein said p-well is implanted using boron.

11. The method of claim 7, wherein said p-well is implanted using boron difluoride $BF_2$.

12. The method of claim 7, wherein said p-well terminates under said first STI structure.

13. The method of claim 7, wherein said field region is located between said second STI structure and said third STI structure.

14. The method of claim 7, wherein said $n^+$ sources abut against said first STI structure and said second STI structure.

15. The method of claim 7, wherein said $p^+$ drains abut against said third STI structure and said fourth STI structure.

16. The method of claim 7, wherein said $p^+$ ground tab contacts said first p-region OTP implant.

17. The method of claim 7, wherein said second p-region OTP implant under said third STI structure makes contact with said first p-region OTP implant.

18. The method of claim 7, wherein a junction from said first p-region OTP implant to said n-well under said field region acts as a reverse biased diode.

19. The method of claim 7, wherein a junction from said second p-region OTP implant under said third STI structure to said n-well located between said third STI structure and said fourth STI structure acts as a reverse biased diode.

20. The method of claim 7, wherein said arsenic is implanted to a concentration ranging from $1\times10^{13}$ to $5\times10^{14}$ atoms/cm$^3$ at energies ranging from 10 keV to 80 keV.

21. The method of claim 9, wherein said phosphorus is implanted to a concentration ranging from $1\times10^{11}$ to $1\times10^{13}$ atoms/cm$^3$ at energies ranging from 10 keV to 80 keV.

22. The method of claim 10, wherein said boron and boron difluoride is implanted to a concentration ranging from $1\times10^{13}$ to $1\times10^6$ atoms/cm$^3$ at energies ranging from 10 keV to 60 keV.

23. The method of claim 7, wherein said n-well and p-well concentration ranges from $5\times10^{15}$ to $1\times10^{18}$ atoms/cm$^3$.

24. The method of claim 7, wherein said shallow trench isolation (STI) structure has a depth ranging from 0.05 to 0.4 um, and the width ranges from 0.1 to 5 um.

25. The method of claim 7, wherein said shallow trench isolation (STI) structures have a width ranging from 0.1 to 5 um.

26. The method of claim 25, wherein a thermal oxide layer of said STI structures has a thickness ranging from 0.05 to 0.4 um.

27. The method of claim 7, wherein ion implantation energies for a voltage threshold $V_T$ range from 20 keV to 100 keV.

28. The method of claim 7, wherein doping levels of said lightly doped N (Nldd) drains and P drains (Pldd) range from $1\times10^{13}$ to $5\times10^{14}$ atoms/cm$^2$.

29. The method of claim 7, wherein a focusing depth for said first p-region OTP implant ranges from 0.1 to 0.8 um from said field region.

30. The method of claim 7, wherein said field region combined with said third STI structure together have a width ranging from 0.2 um to 2 um.

* * * * *

UNITED STATES PATENT AND TRADEMARK OFFICE
CERTIFICATE OF CORRECTION

PATENT NO. : 6,054,344  
DATED : April 25, 2000  
INVENTOR(S) : Mong-Song Liang, Shyh-Chyi Wong Page 1 of 1

It is certified that error appears in the above-identified patent and that said Letters Patent is hereby corrected as shown below:

<u>Column 8, claim 22,</u>  
Line 27, change "$1 \times 10^6$" to -- $1 \times 10^{16}$ --

Signed and Sealed this

Sixteenth Day of October, 2001

Attest:

*Nicholas P. Godici*

NICHOLAS P. GODICI  
*Attesting Officer*    *Acting Director of the United States Patent and Trademark Office*